United States Patent
Lin et al.

(10) Patent No.: US 7,088,961 B2
(45) Date of Patent: Aug. 8, 2006

(54) CIRCUITRY TO ESTABLISH A WIRELESS COMMUNICATION LINK

(75) Inventors: Ernie Lin, North Andover, MA (US); Adolf J. Giger, Boxford, MA (US)

(73) Assignee: Nebo Wireless, LLC, North Andover, MA (US)

( * ) Notice: Subject to any disclaimer, the term of this patent is extended or adjusted under 35 U.S.C. 154(b) by 97 days.

(21) Appl. No.: 10/446,372

(22) Filed: May 28, 2003

(65) Prior Publication Data

US 2004/0087278 A1    May 6, 2004

Related U.S. Application Data

(63) Continuation-in-part of application No. 10/289,037, filed on Nov. 6, 2002.

(51) Int. Cl.
*H04B 1/40* (2006.01)
(52) U.S. Cl. .............. 455/74.1; 455/554.2; 455/114.2; 455/127.2; 455/234.1; 379/406.01
(58) Field of Classification Search ....... 455/41.1–41.3, 455/74, 74.1, 552.1, 553.1, 554.1, 554.2, 455/556.1, 556.2, 66.1, 555–557, 575.1, 455/90.1–90.3, 114.2, 116, 127.2, 232.1–253.2, 455/296–308; 371/406.01–406.16, 428.01–433.13
See application file for complete search history.

(56) References Cited

U.S. PATENT DOCUMENTS

| | | |
|---|---|---|
| 4,003,006 A | 1/1977 | Mandeville et al. |
| 4,171,469 A | 10/1979 | Brooks |
| 4,523,155 A | 6/1985 | Walczak et al. |
| 4,727,535 A | 2/1988 | Brandt |
| 4,813,073 A | 3/1989 | Ling |
| 4,835,765 A | 5/1989 | Bergmans et al. |
| 4,970,715 A | 11/1990 | McMahan |
| 5,267,310 A * | 11/1993 | Yoshiba ..................... 379/416 |
| 5,297,203 A | 3/1994 | Rose et al. |
| 5,553,318 A | 9/1996 | Ohmagari et al. |
| 5,587,998 A | 12/1996 | Velardo, Jr. et al. |
| 5,627,857 A | 5/1997 | Wilson |
| 5,711,012 A | 1/1998 | Bottoms et al. |
| 5,812,537 A | 9/1998 | Betts et al. |
| 5,819,165 A | 10/1998 | Hulkko et al. |
| 5,926,756 A | 7/1999 | Piosenka et al. |
| 5,930,719 A | 7/1999 | Babitch et al. |
| 5,955,921 A | 9/1999 | Ide et al. |
| 5,978,689 A | 11/1999 | Tuoriniemi et al. |

(Continued)

FOREIGN PATENT DOCUMENTS

JP          405095412 A *    4/1993   .................. 379/31

OTHER PUBLICATIONS

U. S. Appl. No. 09/658,049, filed Sep. 8, 2000.

(Continued)

*Primary Examiner*—Charles Craver
(74) *Attorney, Agent, or Firm*—Fish & Richardson P.C.

(57) ABSTRACT

Circuitry to transmit an analog data signal over a wireless communication link includes a receiver that receives a data signal, an automatic gain control circuit that keeps a peak amplitude of the data signal substantially constant and within a predetermined linear amplification range, and a transmitter, having the predetermined linear amplification range, that receives the data signal from the automatic gain control circuit and that outputs the data signal.

34 Claims, 7 Drawing Sheets

U.S. PATENT DOCUMENTS

| | | |
|---|---|---|
| 6,070,058 A | 5/2000 | Waldroup et al. |
| 6,072,998 A | 6/2000 | Kaku |
| 6,147,979 A | 11/2000 | Michel et al. |
| 6,172,985 B1 * | 1/2001 | Gilbert .................. 370/465 |
| 6,289,213 B1 | 9/2001 | Flint et al. |
| 6,477,250 B1 * | 11/2002 | Sheets .................. 379/404 |
| 6,505,222 B1 | 1/2003 | Davis et al. |
| 6,522,640 B1 | 2/2003 | Liebenow |
| 6,591,090 B1 | 7/2003 | Vuorio et al. |
| 6,611,681 B1 | 8/2003 | Henderson |
| 6,711,391 B1 | 3/2004 | Walker et al. |
| 6,745,055 B1 | 6/2004 | Iyengar et al. |
| 6,751,474 B1 | 6/2004 | Lin et al. |
| 6,763,228 B1 | 7/2004 | Prentice et al. |
| 2002/0049036 A1 | 4/2002 | Bullock et al. |

OTHER PUBLICATIONS

U. S. Appl. No. 09/670,449, filed Sep. 26, 2000.
U. S. Appl. No. 10/289,037, filed Nov. 6, 2002.
U. S. Appl. No. 10/310,664, filed Dec. 5, 2002.
U. S. Appl. No. 60/435,442, filed Dec. 20, 2002.
International Search Report for Application PCT/US03/35527.

* cited by examiner

CIRCUITRY TO ESTABLISH A WIRELESS COMMUNICATION LINK

CROSS-REFERENCE TO RELATED APPLICATION

This application is a continuation-in-part of U.S. patent application Ser. No. 10/289,037, which was filed on Nov. 6, 2002. The contents of U.S. patent application Ser. No. 10/289,037 are hereby incorporated by reference into this application as if set forth herein in full.

TECHNICAL FIELD

This application relates to establishing a wireless communication link between a modem and a telephone line.

BACKGROUND

Computers with built-in dial-up modems often connect to networks, such as the Internet, via a wired connection. One example of a wired connection is a two-wire telephone cord that connects a personal computer (PC) modem port to a wall jack. There, the two-wire telephone cord meets a twisted pair telephone line from the telephone company's central office (referred to as the "local loop").

There are numerous limitations associated with the use of wired connections. For example, computers that require wired connections have limited portability, since their operation is dependent upon proximity to a nearby telephone jack or outlet. Wireless links therefore have been developed to reduce the need for wired connections. Generally speaking, a wireless link comprises a way of transmitting data without the use of wires.

One existing type of wireless link makes use of the IEEE 802.11b standard. One product of this type includes a base unit and one or more wireless circuit cards that can be mounted in portable computers. The IEEE standard makes it possible to achieve data rates up to 11 Mbit/s and to handle numerous simultaneous users in an Ethernet Local Area Network (LAN). The digital modulation format is either Frequency Hopping Spread Spectrum (FHSS) or Direct Sequence Spread Spectrum (DSSS) operating in the 2.4 GHz ISM (Industrial, Scientific, Medical) radio band.

Since very high data rates can be transmitted, the foregoing product is mainly used for distribution of signals from cable and DSL modems and for networking computers. The base unit in the product also contains a dial-up modem that can be connected to a telephone jack. The 56 kbit/s binary data stream associated with the dial-up modem, together with additional control bits, are converted into the 802.11b format and sent over the 2.4 GHz radio channel to one or more laptop computers. If only used to transmit a 56 kbit/s signal, this type of data transmission method can be rather expensive.

Other types of wireless modems exist to transmit a dial-up modem signal over a short radio path from a telephone wall jack to a single portable computer. These modems digitize an incoming V.34 or V.90 signal via an A/D (analog-to-digital) converter and transmit the resulting digital stream over a radio channel using QPSK (Quadrature Phase-Shift Keying) modulation. Since a V.90 signal has to be transmitted with very high fidelity, a high-bit (e.g., ten to twelve bit) A/D converter is needed on the transmitting side and a high-bit D/A (digital-to-analog) converter is needed on the receiving side.

The foregoing configuration results in transmission of high bit rates over a radio channel, requiring RF (radio frequency) bandwidths of about 200 kHz. Such bandwidth is much larger than the 30 kHz needed for analog FM cordless telephones or the 100 kHz needed for some digital cordless telephones. Excessive bandwidth requirements make modems that use the foregoing configuration less attractive.

The distance from an Internet user to a central office of a telephone company, where four-wire ISP (Internet Service Provider) equipment connects, can vary from a few hundred feet to typically about three miles. This makes the telephone interface difficult to match precisely, sometimes resulting in substantial echoes in the system. Most "wired" modems are therefore equipped with a modem echo canceller, which can remove much of the echoes.

In a wireless system, echoes sometimes surpass the data signals and can saturate the radio channel. A saturated or over-driven circuit causes nonlinear distortions in the data signal which render the echo canceller in the modems ineffective.

Heretofore, an echo canceller was included in the base unit of a wireless modem to eliminate echoes before they could saturate the RF channel. Since modern echo cancellers are digital, this configuration requires conversion of signals into digital and later conversion back into analog. The A/D and D/A conversions effectively introduce an added complication to the data channel and, unless very high-bit converters are used, slow down the V.90 speed to that of V.32 or V.34.

Signal levels, due to the distance variations mentioned above, can vary over 30 dB in a normal dial-up modem. This is not an issue during wired mode operation, since such a modem can handle the variations. However, signal level variation can become an issue in a wireless system. If the signal is reduced by 30 dB at the input of a frequency shift keying (FSK) radio channel, the frequency deviation will be reduced accordingly, reducing the signal-to-noise ratio by 30 dB and rendering the system inoperable. A standard way of handling this is to introduce an AGC (automatic gain control) or ALC (automatic level control) unit to make the input level constant. However, a modern modem sends out tones of different levels in the beginning of communication, called a "handshake", to calibrate the modem circuits to account for the distance and echo variations. A conventional AGC/ALC circuit would interfere with this process, leaving the system unstable.

SUMMARY

In general, in one embodiment, the invention is directed to circuitry to transmit an analog data signal over a wireless communication link. The circuitry includes a receiver that receives a data signal, an automatic gain control circuit that keeps a peak amplitude of the data signal substantially constant and within a predetermined linear amplification range, and a transmitter, having the predetermined linear amplification range, that receives the data signal from the automatic gain control circuit and that outputs the data signal. This aspect may also include one or more of the following features.

The circuitry may include a hybrid circuit that isolates an incoming data signal from an outgoing data signal. The hybrid circuit may produce the data signal based on the incoming data signal and may output the data signal to the automatic gain control circuit. The automatic gain control circuit may use a dial tone of a telephone connection to set a gain level for the data signal at a beginning of communication. The gain level may remain substantially constant during communication.

The data signal output by the hybrid circuit may exceed the predetermined linear amplification range of the transmitter. The automatic gain control circuit may limit a voltage of the data signal output by the hybrid circuit to reduce nonlinear distortion in the transmitter.

The circuitry may include a duplexer that maintains separation between transmitted and received data signals. The transmitter may be a radio frequency transmitter. The radio frequency transmitter may include a frequency modulation deviator which performs frequency shift keying modulation of a carrier of the data signal.

The circuitry may include circuitry to reduce a signal voltage of the data signal prior to input to the frequency modulation deviator. The circuitry may include a microprocessor which sends and receives control signals to a remote unit that communicates with the circuitry over the wireless communication link.

In general, in another aspect, the invention is directed to an apparatus for transmitting a data signal over a wireless communication link. The apparatus includes a base unit having a wired connection to a telephone line. The base unit transmits data to and from the telephone line via the wired connection. The apparatus also includes a remote unit having a wired connection to a modem. The remote unit transmits data to and from the modem via the wired connection. The remote unit and the base unit communicate with each other over the wireless communication link. The base unit includes a radio frequency transmitter to transmit an analog data signal to the remote unit, and an automatic gain control circuit that keeps a peak amplitude of the analog data signal substantially constant and within a predetermined linear amplification range of the radio frequency transmitter. This aspect may also include one or more of the following features.

The remote unit may be comprised of a handset of a cordless telephone, a Peripheral Component Microchannel Interconnect Architecture card, a Universal Serial Bus connector, or some combination thereof. The modem may reside in at least one of a laptop computer, a desktop computer, and a personal digital assistant.

The base unit may include a radio frequency receiver to receive data from the remote unit. The base unit may also include a hybrid circuit that isolates an incoming data signal from an outgoing data signal. The hybrid circuit may produce the analog data signal based on the incoming data signal and may output the analog data signal to the automatic gain control circuit. The analog data signal output by the hybrid circuit may exceed the predetermined linear amplification range of the transmitter. The automatic gain control circuit may limit a voltage level of the analog data signal to reduce nonlinear distortion in the transmitter.

The base unit may include a duplexer that maintains separation between transmitted and received data signals. The radio frequency transmitter in the base unit may include a frequency modulation deviator which performs frequency shift keying modulation on the analog data signal. The base unit may include circuitry to reduce a signal voltage of the analog data signal prior to input to the frequency modulation deviator, and/or a microprocessor which sends and receives control signals to the remote unit over the wireless communication link.

The remote unit may include a hybrid circuit that isolates an incoming data signal from an outgoing data signal. The hybrid circuit may produce an output data signal based on the incoming data signal. The automatic gain control circuit may reduce echoes produced by the hybrid circuit in the outgoing data signal.

In general, in another aspect, the invention is directed to an apparatus for transmitting data or voice over a wireless communication link. The apparatus includes means for operating the apparatus as a wireless data link, means for operating the apparatus as a cordless telephone, and means for switching operations between the wireless data link and the cordless telephone. This aspect may include one or more of the following features.

The means for operating the apparatus as a cordless telephone may produce and transmit an analog signal and/or a digital signal. The means for operating the apparatus as a wireless data link may transmit an analog signal.

Other features and advantages of the invention will become apparent from the following description, including the claims and drawings.

DESCRIPTION OF THE DRAWINGS

Like reference numerals in different figures refer to like elements.

DESCRIPTION

Figure 1:
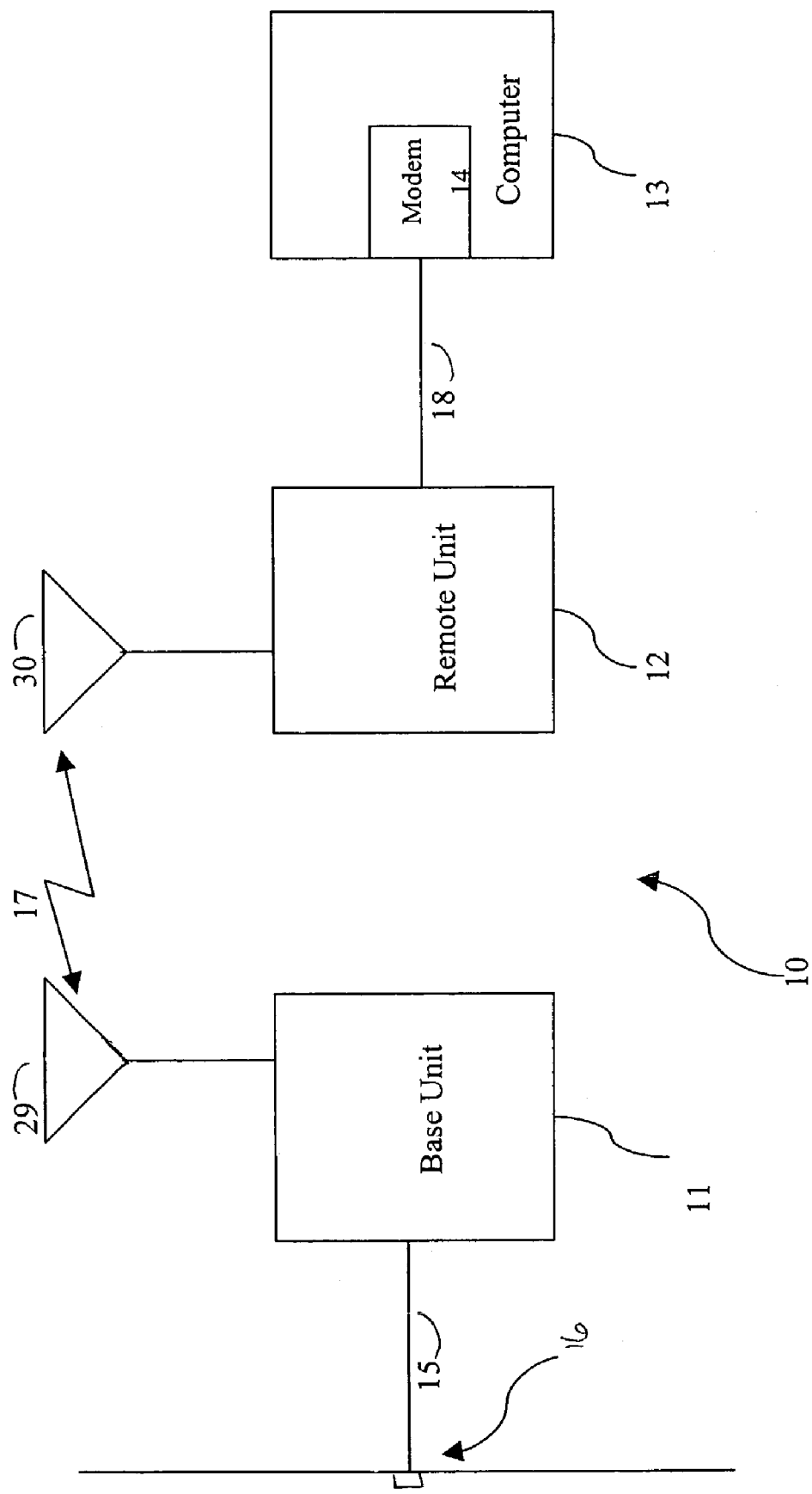
FIG. 1 is a block diagram of a wireless link.

The circuitry described herein is used for transmitting an analog data signal of the type used by dial-up modems over a wireless communication link. Such data signals (e.g., a V.34 signal) have complex multi-state QAM (Quadrature Amplitude Modulation) constellations and resemble an analog baseband signal transmitted in the 4 kHz telephone channel. Another example of a data signal that may be transmitted is a V.90 signal. A V.90 signal is somewhat special in that it is comprised of a pulse amplitude modulated (PAM) signal with 128 discrete amplitude levels, which are unequally spaced according to the mu-law expander used in the digital Public Switched Telephone Network (PSTN).

Faithful transmission of dial-up modem type signals requires a channel that is characterized by low noise and high amplitude linearity. One way to transmit such signals, in accordance with the invention, is to transmit the signals over an RF (or "radio") channel by direct frequency modulation (FM) of an RF carrier with a V.34 or V.90 signal. For V.90 signals, this transmission method amounts to transmitting an FSK signal with 128 unequally spaced discrete levels. The RF bandwidth required to transmit such signals is a modest 30 kHz, which is similar to the RF bandwidth used for the analog FM channel in conventional cordless telephones.

The circuitry described herein establishes a short-range wireless communication link between a dial-up modem and a twisted pair telephone line to transmit signals in the manner described above. The circuitry reduces the need for the two-wire telephone cord customarily required for a dial-up Internet connection without affecting performance significantly. The modem circuitry may operate according to standards for dial-up connections, such as V.90, providing a data speed of up to 56 kilobits/second (kb/s).

In accordance with standard cordless telephone operation, the circuitry described herein uses an analog FM/FSK architecture, as opposed to a digital architecture, to transmit V.90 data signals over the classical voice frequency channel. Data transmitted in this "voiceband" frequency channel is referred to as voiceband data. The circuitry thus avoids analog-to-digital and digital-to-analog conversions that could degrade the performance of the V.90 signals, and avoids the higher bandwidths (e.g., 200 kHz) associated with digital RF modulation. A standard digital cordless telephone channel may alternatively be used to transmit a dial-up data signal.

The circuitry uses a novel and cost-effective automatic gain control (AGC) circuit to address the problem of echoes from the telephone line adversely affecting the data through nonlinear distortion in the circuitry. At the same time, the AGC circuit maintains a data signal level that is sufficient to achieve a necessary signal-to-noise ratio in the RF channel.

The wireless link established by the circuitry described herein is produced using two components: a base unit and a remote unit. The arrangement of these components is described in the following.

A short length of two-wire telephone cord connects the modem port of a computer to the remote unit. This remote, battery operated (or USB-powered, where "USB" stands for Universal Serial Bus) unit may be housed in a small box with an attached antenna. The two-wire telephone cord simultaneously carries modem data signals in both directions of transmission, from the modem (upstream) and to the modem (downstream), for full duplex operation. As noted above, the modem data signals may be of the V.90 type, which are comprised of a 128-level baseband signal with a spectral width of less than 4 kHz that can be transmitted over the voiceband frequency channel.

The remote unit contains a radio transmitter and receiver, which may operate in the 900 MHz or 2.4 GHz cordless telephone radio band, to carry modem data signals traveling in opposite directions. Transmission over the wireless channel is "four-wire", as opposed to the two-wire transmission over a telephone cord.

Wireless transmission may be performed by frequency modulation. An FM channel is able to meet the stringent linearity requirements needed for the transmission of V.90-type signals.

The remote unit communicates via the wireless link with the base unit, which is located near a wall telephone jack. The remote unit communicates using slightly different carrier frequencies for the two directions of transmission. The base unit contains a corresponding radio transmitter and receiver, along with circuitry needed to transmit the two (duplex) voiceband V.90 signals to and from the wall jack and the telephone line.

The base unit includes circuitry that limits the amount of nonlinear distortion in the data signal that is transmitted to the modem. This circuitry employs an AGC circuit that limits the peak amplitude that can be transmitted over the FM radio channel and keeps distortions within the stringent requirements of the V.90 system. By using automatic gain control in the base unit, the wireless link becomes substantially linear and, thus, essentially invisible to the transmitted V.90 data signal. This means that the function of canceling echoes on the telephone line can be performed by the standard echo canceller built into the modem located in the computer at the other end of the wireless link.

Circuitry for establishing the wireless link may leverage chip sets developed for existing analog cordless telephones where FM techniques are used, in addition to the AGC in the base unit and additional circuitry, described below, in the remote unit. This circuitry provides a virtually seamless connection with a computer modem, without requiring modifications to either hardware or software in the modem (e.g., protocols, etc.).

The remote unit may be battery-operated and can be recharged by placing it in the base unit. This will also reset a security code, in accordance with standard cordless telephone operation. It is also possible to supply an operating voltage from the computer through a USB cable. A fixed security code may be employed. Such a code may be stored in an EEPROM located in the remote unit.

There are sixty RF channels available in the 900 MHz cordless telephone band. RF channel selection can be either automatic or via a button on the remote unit.

FIG. 1 shows a wireless communication system 10. Wireless communication system 10 includes base unit 11 and remote unit 12. Parts of these two units may be similar to standard 900 MHz cordless telephone circuitry.

Remote unit 12 interfaces with computer 13, allowing computer 13, with its built-in modem 14, to transmit/receive data over a two-wire telephone cord 18 and an RF link 17. Computer 13 may be any type of processing device, such as a laptop, a desktop PC, or a personal digital assistant (PDA) with a built-in dial-up modem 14 operating at speeds up to 56 kb/s according to ITU specification V.90, for instance. It is noted that other types of modems may be used, e.g., V.34 types as noted above, operating at lower data speeds.

Wireless Link Interface

Base unit 11 connects to the telephone company central office and to the Public Switched Telephone Network (PSTN) through a two-wire telephone cord 15, which is plugged into telephone wall jack 16. Telephone wall jack 16 is typically an RJ11 type connector.

Communication between base unit 11 and remote unit 12 is via RF link 17. RF link 17 transmits standard voiceband frequencies contained in the baseband spectrum extending from 0.15 kHz to 4 kHz. This is also the spectrum occupied by the voiceband data signal (V.90, for instance).

Thus, data signals are transmitted from base unit 11 to remote unit 12 (and vice versa) via the RF portion of the wireless communication system. The range of this RF link may vary, but it is typically several hundred feet or longer. After demodulation, the data signals are transmitted between the remote unit 12 and computer 13 via a two-wire telephone cord 18 with standard RJ11 telephone plugs at each end.

Base Unit

Figure 2:
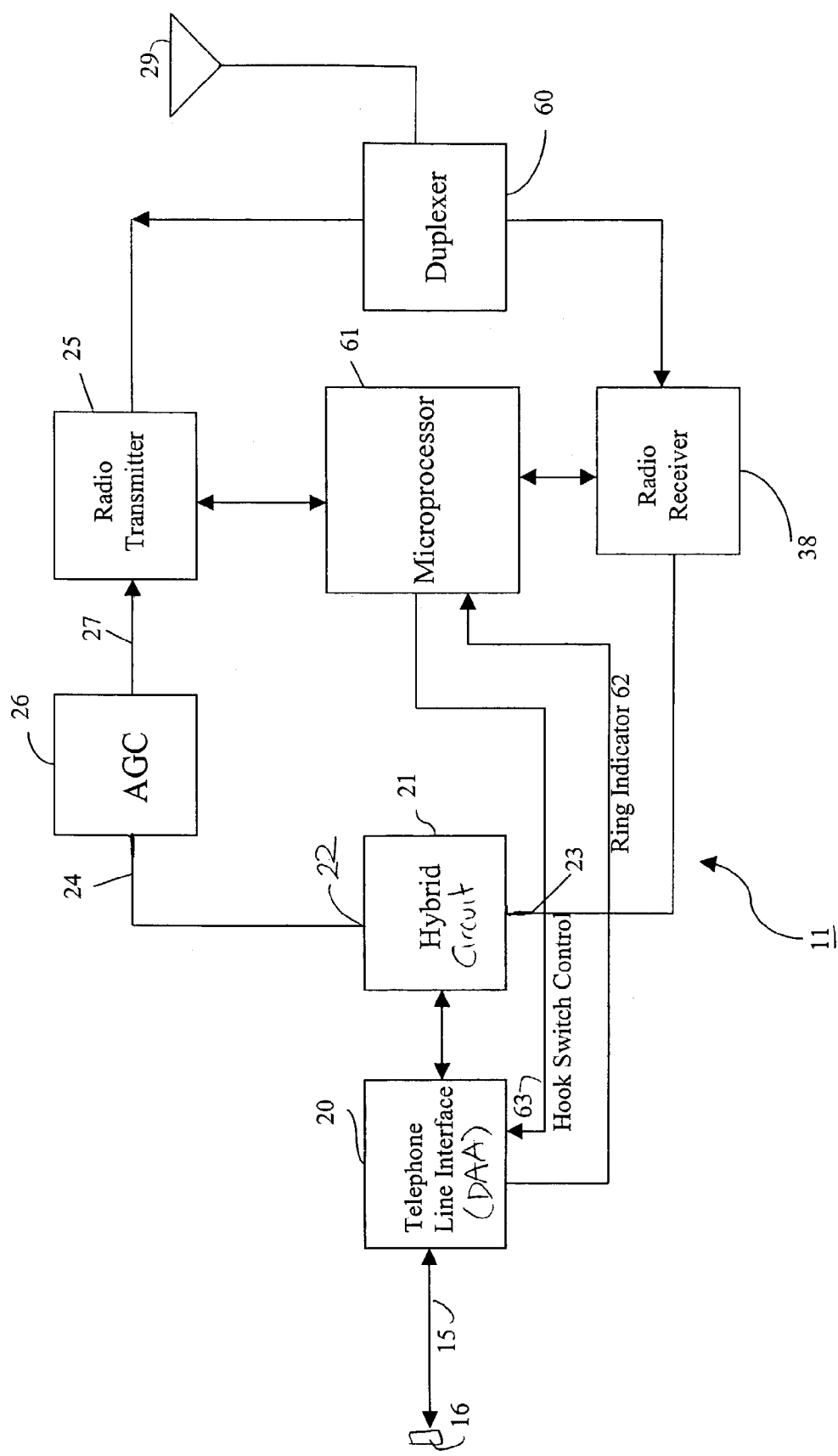
FIG. 2 is a block diagram of a base unit for use in establishing the wireless link.

FIG. 2 shows a block diagram of base unit 11. The two circuits of base unit 11 that are nearest to the telephone central office are telephone line interface 20 and hybrid circuit 21. Telephone line interface 20, also called a Data Access Arrangement (DAA), connects through cord 15, wall outlet 16, and a twisted-pair telephone line to equipment (not shown) in the telephone central office.

Telephone interface 20 includes a ring detector, a hook switch, a DC (Direct Current) loop holding circuit, and an isolation transformer (none shown). A description of circuitry that may be included in telephone interface 20 is found in U.S. patent application Ser. No. 09/658,049, entitled "Wireless Modem", filed on Sep. 8, 2000, the contents of which are incorporated herein by reference.

Hybrid circuit 21, which includes a resistive hybrid and operational amplifiers (not shown), converts two-wire to four-wire telephone operation. More specifically, one function of hybrid circuit 21 is to separate two signals simultaneously flowing in opposite directions in the two-wire telephone line (so called "full-duplex operation") and make them available at two distinct terminals (four wires) 22 and 23. An incoming (from the central office) data signal appears at hybrid terminal 22 and an outgoing data signal is applied to hybrid terminal 23.

Hybrid circuit 21 is a bridge circuit; therefore, isolation of the two signals at terminals 22 and 23 is achieved if all of the impedances connected to the bridge circuit are well-matched. A considerable impedance mismatch can exist, which can cause the signal applied to terminal 23 to be partially reflected from the telephone central office and appear at terminal 22. This "echo" will be added to the incoming signal, causing the amplitude of the resulting signal 24 to be, e.g., several times the amplitude of the desired signal.

The resulting signal 24 (with echo) can cause overload and nonlinear distortion in radio transmitter 25. Echoes, embedded in signal 24, after having been corrupted by nonlinear distortion, cannot be effectively eliminated by the echo canceller in modem 14 of computer 13. Therefore, to reduce overload and nonlinear distortion, AGC circuit 26 is included in base unit 11 between hybrid circuit 21 and radio transmitter 25. AGC circuit 26 includes a peak amplitude detector with a sufficiently long time constant that keeps the peak amplitude of the combined output signal 27 substantially constant and within the linear amplification range of radio transmitter 25. Since AGC circuit 26 reduces nonlinear distortions, RF link 17 essentially becomes invisible to the modem data signal. Thus, an echo canceller in modem 14 will be able to cancel substantially all of, and in some cases all of, the echo appearing at hybrid terminal 22. AGC circuit 26 also keeps the signal amplitude at terminal 27 from falling to very low values, as would be the case for very long "loops" to the central office. Low signal amplitudes result in low signal-to-noise ratios on the RF channel used for transmission.

In contrast to applications of AGC circuits at intermediate frequencies (IF) where nonlinear distortion is not an issue, AGC circuit 26 is working at a baseband frequency where linearity requirements become stringent. A solution to meeting such requirements is either the use of special linearized junction devices with gains that can be changed using a control voltage or the use of resistive step attenuators controlled by digital commands.

Gain control may be direct or through feedback. Direct control involves measuring an incoming voltage 24, followed by adjusting voltage gain to achieve a constant output signal 27. Feedback control, on the other hand, involves measuring output 27 and keeping it constant through a gain adjustment or attenuation.

One goal of AGC operation is to obtain a fixed gain (or attenuation) setting, which optimizes the data channel in normal operation. This process is complicated, however, by the start-up procedure (i.e., the "handshake") used in V.34 and V.90 data transmission systems. This startup procedure includes several phases lasting for several seconds, in which signals of varying amplitudes are transmitted in both directions of transmission. The startup procedure assumes that the gain of the system is fixed and remains so for subsequent data transmission. The startup procedure requires the gain of circuit 26 to be set even before the first start-up signals are exchanged. This can be achieved by measuring the level of the dial tone obtained from the telephone company central office.

The dial tone is the first signal received. Its level is specified by standards organizations. The dial tone also has a fixed decibel (dB) relationship to the average transmitted level of the data signal. The dial tone therefore allows the gain of circuit 26 to be set (either by forward or feedback control) to produce a voltage 27 close to the optimum for subsequent data transmission. The dB relationship "X" between the dial tone level and voltage 27 can be determined by experiment, using typical echo situations in the "loop". Unusually severe echoes would require lowering voltage 27 in order to avoid increased nonlinear distortion in the RF channel used for transmission. This could be achieved by increasing the value of X in steps of 1 dB, for instance.

Imperfect echo cancellation, thermal noise (poor signal-to-noise ratio), and interference are sources of transmission errors. These may cause modem 14 to revert to half duplex operation, to reduce data transmission speed (e.g., from 56 kb/s), and/or to initiate an automatic request for retransmission of a data signal.

Radio transmitter 25 converts a data signal into a modulated RF signal and radio receiver 38 converts a modulated RF signal to a data signal. Radio transmitter 25 and radio receiver 38 operate on different frequencies and are connected to common antenna 29 through duplexer 60. Antenna 29 transmits/receives modulated RF signals to/from remote unit 12.

Techniques can be used to modulate the RF signal in radio transmitter 25, including FSK modulation, which is also used widely in some digital cellular telephones. With FSK, a V.90 data signal, for instance, is directly applied to an FM deviator in radio transmitter 25. The FM deviator performs FSK modulation on the data signal. It is relatively easy to obtain good modulation linearity, and consequently low distortion, in an FM deviator circuit. If necessary, distortion can be further reduced by simply reducing the signal voltage applied to the deviator. This, however, may reduce the signal-to-noise ratio below the necessary value required for the V.90 signal. The FSK channel is a relatively stable transmission medium whose baseband gain is essentially unaffected by varying RF signal levels (i.e., fading).

Microprocessor 61 controls the functions of base unit 11 and interacts with telephone line interface 20, radio transmitter 25, and radio receiver 38. Microprocessor 61 is also responsible for sending/receiving control signals to/from remote unit 12. In operation, an external caller (an incoming call) operates a ring detector in telephone line interface 20 resulting in a ring indicator signal 62. Microprocessor 61 transmits ring indicator signal 62 over the wireless link to remote unit 12, where its ringer switch 39 operates in response thereto. In the other direction of transmission, a call initiated by computer 13 will cause a hook switch control signal to be transmitted from remote unit 12 to base unit 11. Microprocessor 61 then generates an off-hook condition in line interface 20 through hook switch control signal 63.

Microprocessor 61 is also responsible for automatically selecting a relatively quiet, substantially interference free, radio channel from the total of sixty available channels at 900 MHz.

Remote Unit

Figure 3:
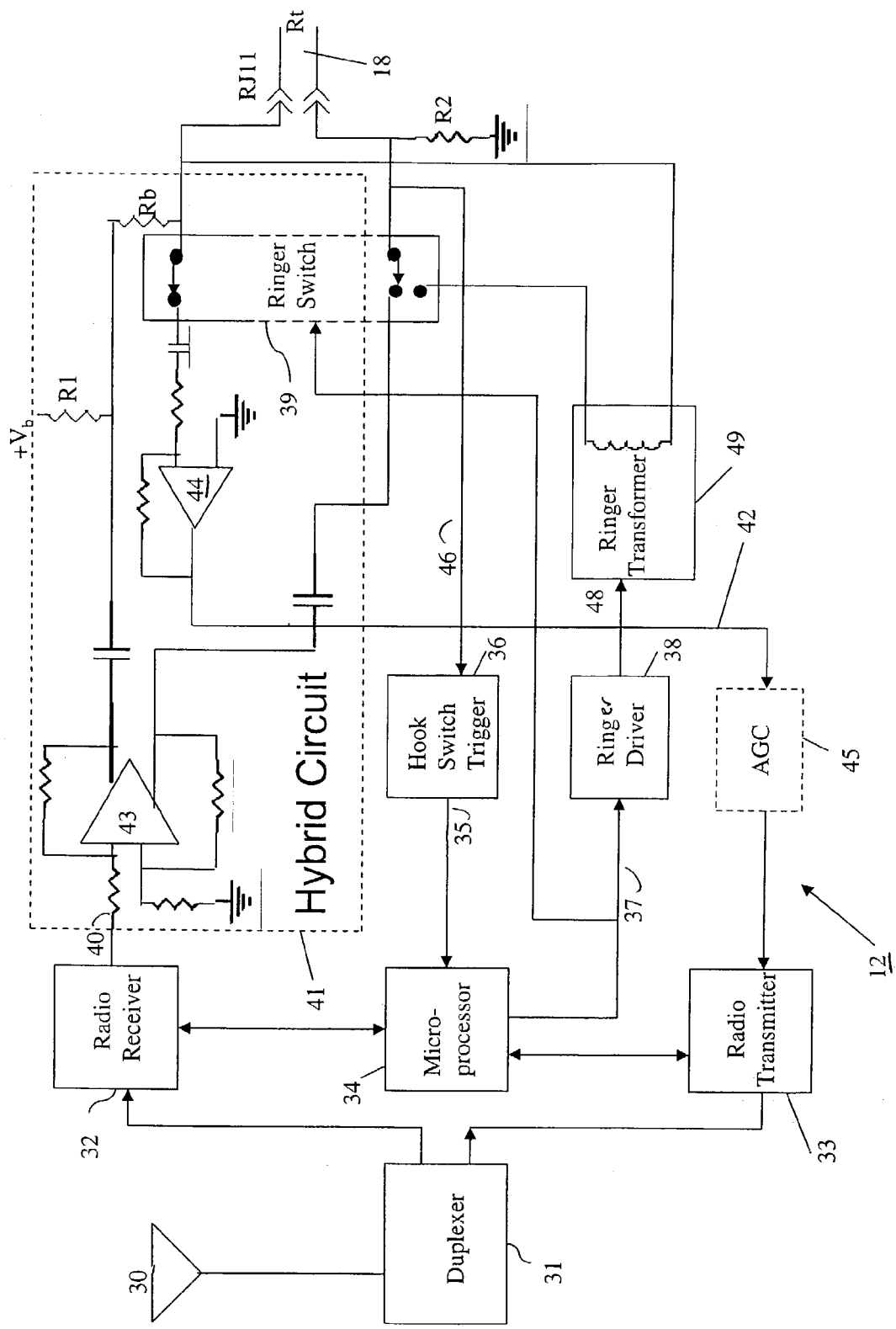
FIG. 3 is a block diagram of a remote unit for use in establishing the wireless link.

FIG. 3 shows a block diagram of circuitry that may be included in remote unit 12. This circuitry includes an antenna 30 for receiving analog data signals over RF link 17 from base unit 11 and for transmitting analog data signals to base unit 11 over RF link 17. A duplexer 31 separates RF signals traveling in opposite directions (to/from base unit 11) by virtue of their different channel frequencies and connects to either a radio receiver 32 or a radio transmitter 33.

Remote unit 12 includes a microprocessor 34 that controls its general operation. In addition, microprocessor 34 receives a signal 35 from hook switch trigger circuit 36, and emits a ring indicator signal 37 to control ringer driver 38 and ringer switch 39. Microprocessor 34 also communicates with microprocessor 61 in base unit 11 (FIG. 2) over RF link 17.

Radio receiver 32 sends demodulated modem data signal 40 (from the telephone central office) into hybrid circuit 41. Radio transmitter 33 receives modem data signal 42 (originating in modem 14) from hybrid circuit 41.

Hybrid circuit 41 operates as a four-wire to two-wire converter, combining signals 40 and 42 (4-wires) so that they can be transmitted onto two-wire telephone cord 18. Hybrid circuit 41, like hybrid circuit 21 in base unit 11, has a balance impedance $R_b$ and two operational amplifiers 43 and 44. The balance impedance $R_b$ approximately matches the line terminating impedance $R_t$ of modem 14. Since different modems may have somewhat different terminating impedances $R_t$, a fixed value of $R_b$ may not sufficiently balance the hybrid. This will lead to echoes being generated in the hybrid circuit. These echoes are typically smaller than those in hybrid circuit 21 of base unit 11. If the echoes cause circuit overload in radio transmitter 33, an AGC circuit 45, similar to circuit 26 in the base unit, may be added to remote unit 12.

The triggering voltage 46 for hook switch trigger circuit 36 will be zero volts as long as the hook switch in modem 14 is open ("on hook"). After modem 14 goes off-hook (starts communicating), the hook switch in modem 14 closes and a DC current starts flowing from battery voltage $+V_b$ in remote unit 12 through resistors $R_1$, $R_b$, $R_2$ of remote unit 12 and the resistance provided by the DC loop holding circuit (identical to the circuit in telephone line interface 20) in modem 14. Voltage 46 thus becomes positive and hook switch trigger circuit 36 initiates hook switch control voltage 35. Hook switch control voltage 35 operates the hook switch (to go "off hook") in telephone line interface 20 of base unit 11.

An incoming call from the telephone central office generates ring indicator voltage 37, as described above, which operates ring driver 38. To produce an audible ring, ring driver 38 normally operates, through voltage (ringer signal) 48, a piezoelectric transducer (not shown). An audible ring is not necessary in the remote unit 12 of wireless communication system 10. Ringer signal 48 is of much higher frequency (as high as several kHz) than the ordinary ringer signal (16 to 60 Hz) coming from a central office, which is required to operate the ringer circuit in modem 14. It may therefore be desirable to replace the high frequency circuit in ring driver 38 with a low frequency circuit. Since low frequency ringer circuits are relatively bulky and expensive, they may sometimes be omitted. This may affect the ability to dial-in to the modem and its associated computer (e.g., to receive faxes).

Remote unit 12 (FIG. 3) may obtain power from a battery (not shown). This battery can be recharged by putting remote unit 12 into a cradle provided on base unit 11. Following standard cordless telephone practice, when (e.g., every time) the remote unit is put into the cradle, a security code can be changed. This will prevent unauthorized over-the-air access of the base unit by foreign remote units. It is also possible to supply the operating voltage from the computer through a USB cable. In this case, a fixed security code may be employed. The code may be stored in an EEPROM located in the remote unit.

Figure 4:
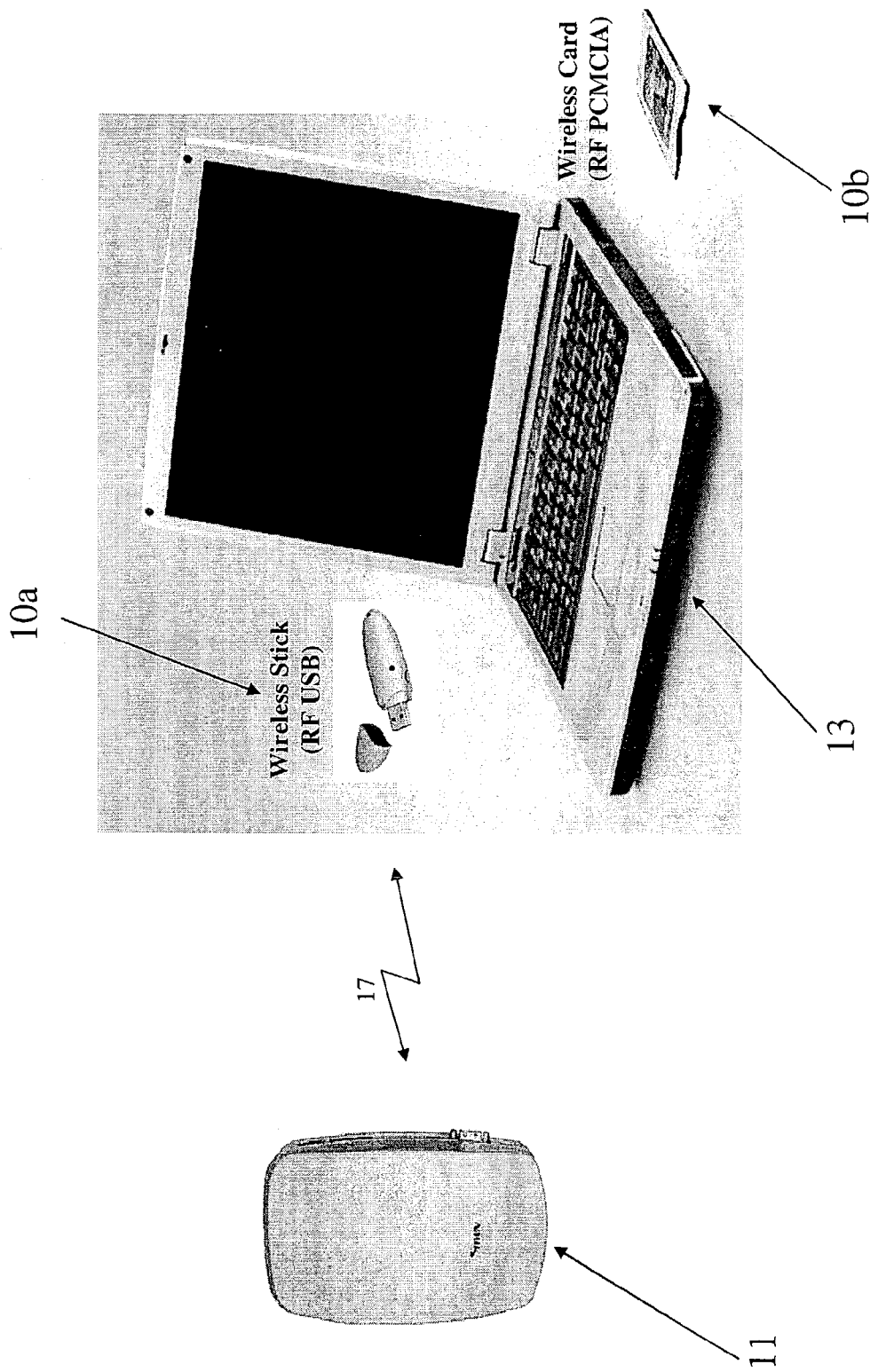
FIG. 4 is a diagram showing a wireless link with a PCMCIA card and a USB stick.

Instead of using a cable connection to a USB connector on a portable computer, remote unit 11 may comprise a USB connector, thereby resembling a "wireless stick" 10a (FIG. 4). This wireless stick can be directly plugged into the portable computer. A telephone wire 18 (not shown), containing RJ11 plugs at each end thereof, may be used to connect the stick to the modem input of the computer.

As shown in FIG. 4, in another embodiment the remote unit comprises a Peripheral Component Microchannel Interconnect Architecture (PCMCIA) card 10b and uses power from a portable computer 13. In this configuration, the remote unit can be plugged into the portable computer, thereby eliminating the need for a separate remote unit.

The portable computer, through the PCMCIA card, provides both power and physical support for the remote unit used to establish the wireless link. Data signals are carried by a telephone wire between a modem terminal of the portable computer and the PCMCIA card acting as a carrier for the remote unit of the wireless link.

Wireless Link with Telephone Features:

The Dual-Function Cordless Telephone

Wireless communication system 10 may include the same functions as a regular cordless telephone when provided with a handset with a speaker and microphone, a dialing pad, a ringer, and other sundry items. These items may be included in wireless communication system 10, thereby allowing wireless communication system 10 to have dual functionality, i.e., to operate as a cordless telephone for transmitting voice or as an RF link for transmitting data between a telephone line and a modem.

Figure 5:
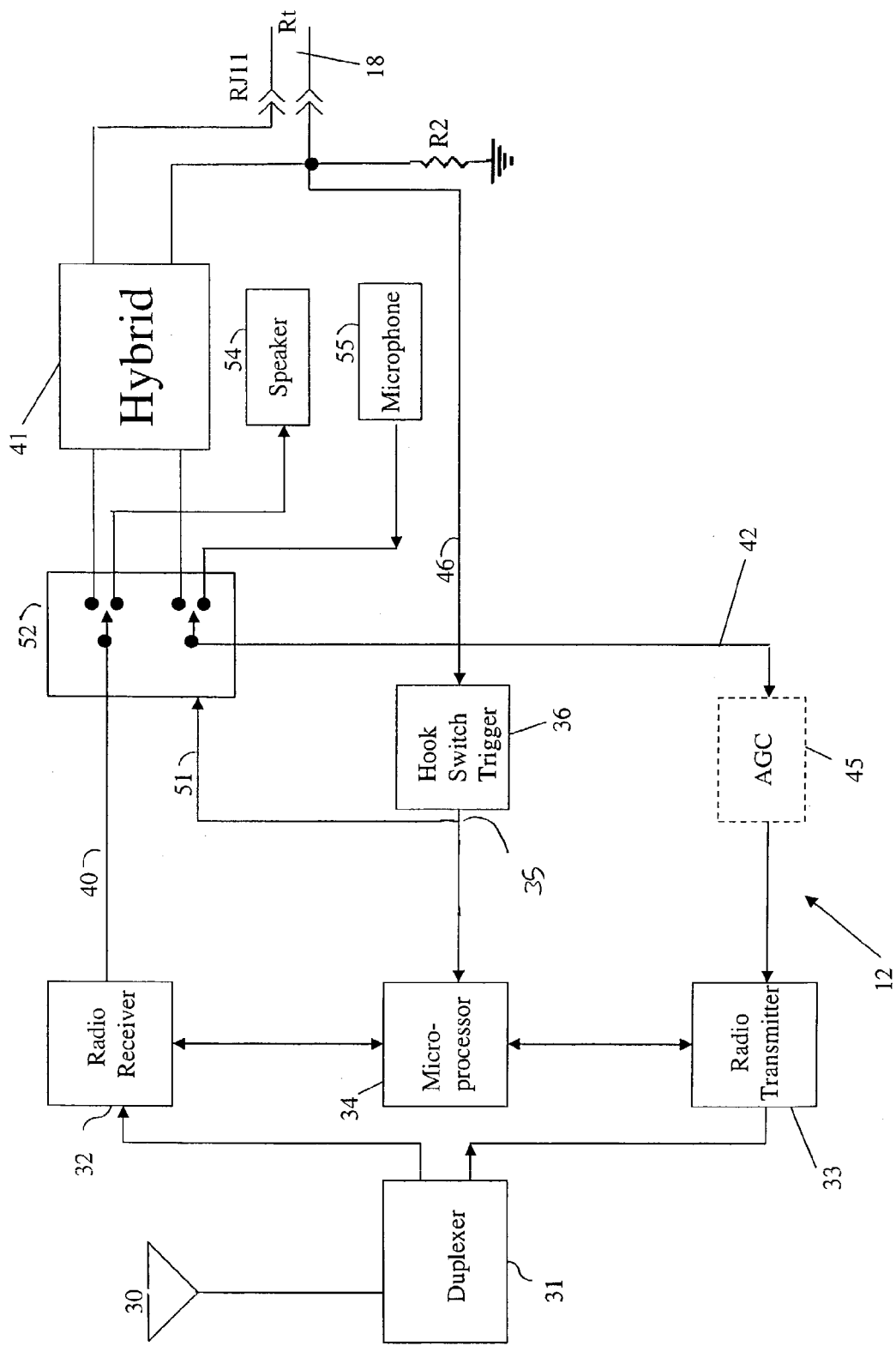
FIG. 5 is a block diagram of a remote unit of a dual-function cordless telephone.

A block diagram of a dual function cordless telephone is shown in FIG. 5. Switch 52 switches between cordless telephone operation and cordless link data operation. A switch initiating signal 51 is identical to hook switch control 35. When no telephone cord 18 is connected from modem 14 (FIG. 1), voltage 46 is zero and switch 52 connects radio receiver 32 to speaker 54, and microphone 55 to radio transmitter 33. At the same time, signal 35 represents one of the inputs to an "OR" circuit in microprocessor 34, the other being the input activated by the telephone button of the cordless handset.

Signal 35 is further used to insert or remove compander circuits in both directions of transmission, depending on whether the unit is used in telephone or data mode, respectively. In this regard, analog cordless telephones employ syllabic companders to improve the signal-to-noise ratio of voice transmissions. The compander operating in the downstream direction (not shown), in this context, includes a compressor acting on signal 27 (FIG. 2) and an expander at the output 40 of radio receiver 32 (FIG. 3). The compander introduces small amounts of nonlinear distortion, which are detrimental to data transmission. The compander also introduces small gain variations in the transmission channel, called tracking errors, that would be detrimental during the start-up phase (echo canceller training sequence) of the V.34 and V.90 data communication. Fortunately, the compander is not required for data transmission because the AGC circuit 26 takes care of the level variation problem. The compander is thus removed when transmitting data. AGC circuits 26 and 45 need not be removed during telephone mode operation.

Figure 6:
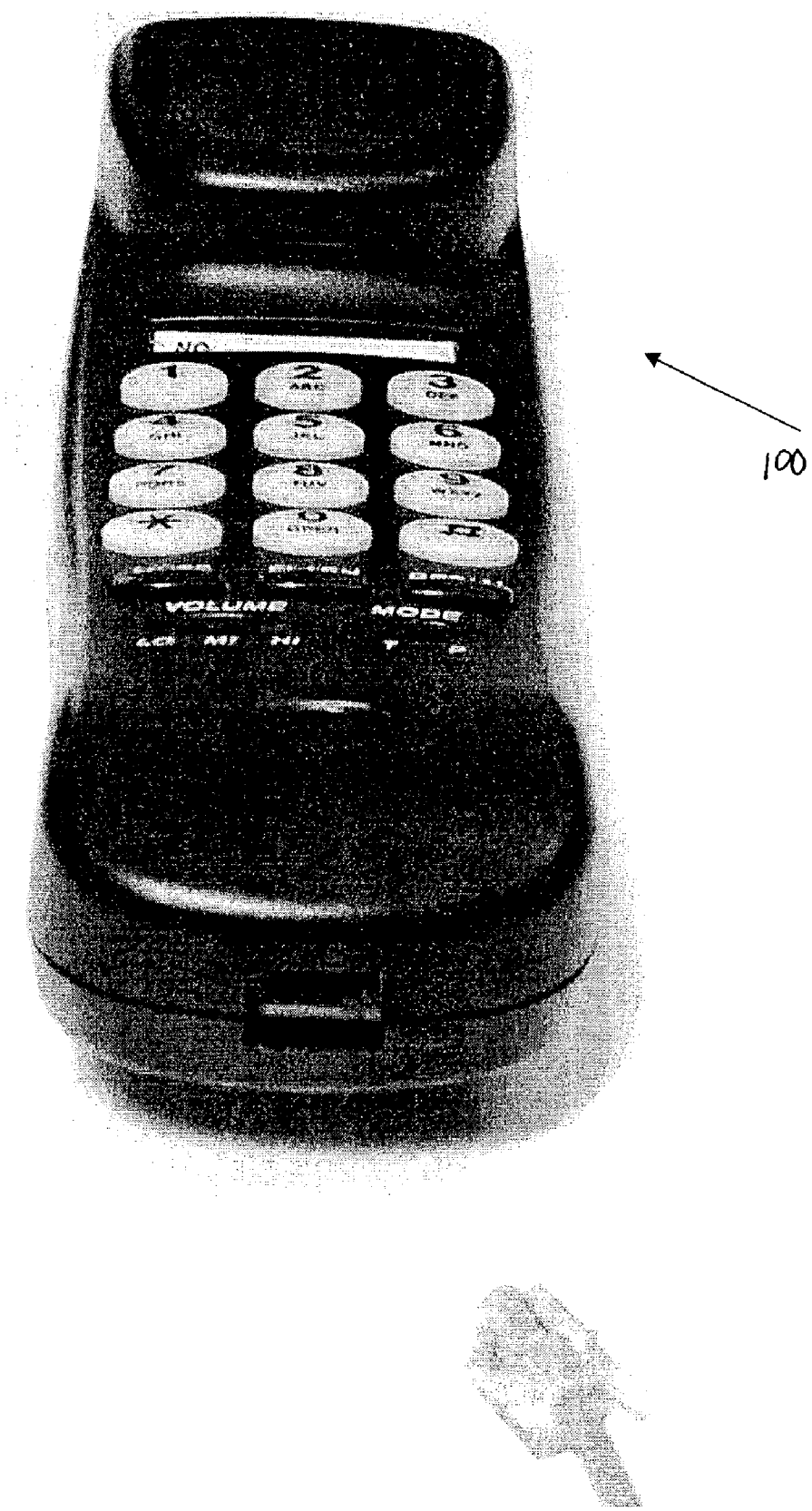
FIG. 6 is a diagram of a remote unit of a dual-function cordless telephone

The remote unit (handset) of the dual-function cordless telephone operates off of a battery that will be recharged when the handset is put back into the cradle in the base unit. A representative example of a handset 100 that may be used is shown in FIG. 6.

Thus, a regular cordless telephone will also serve as a wireless communication link 10 for data communication if the circuits shown in FIGS. 2 and 3 are added. The handset is equipped with a telephone jack (RJ11) for interconnecting the handset with a computer modem.

Figure 7:
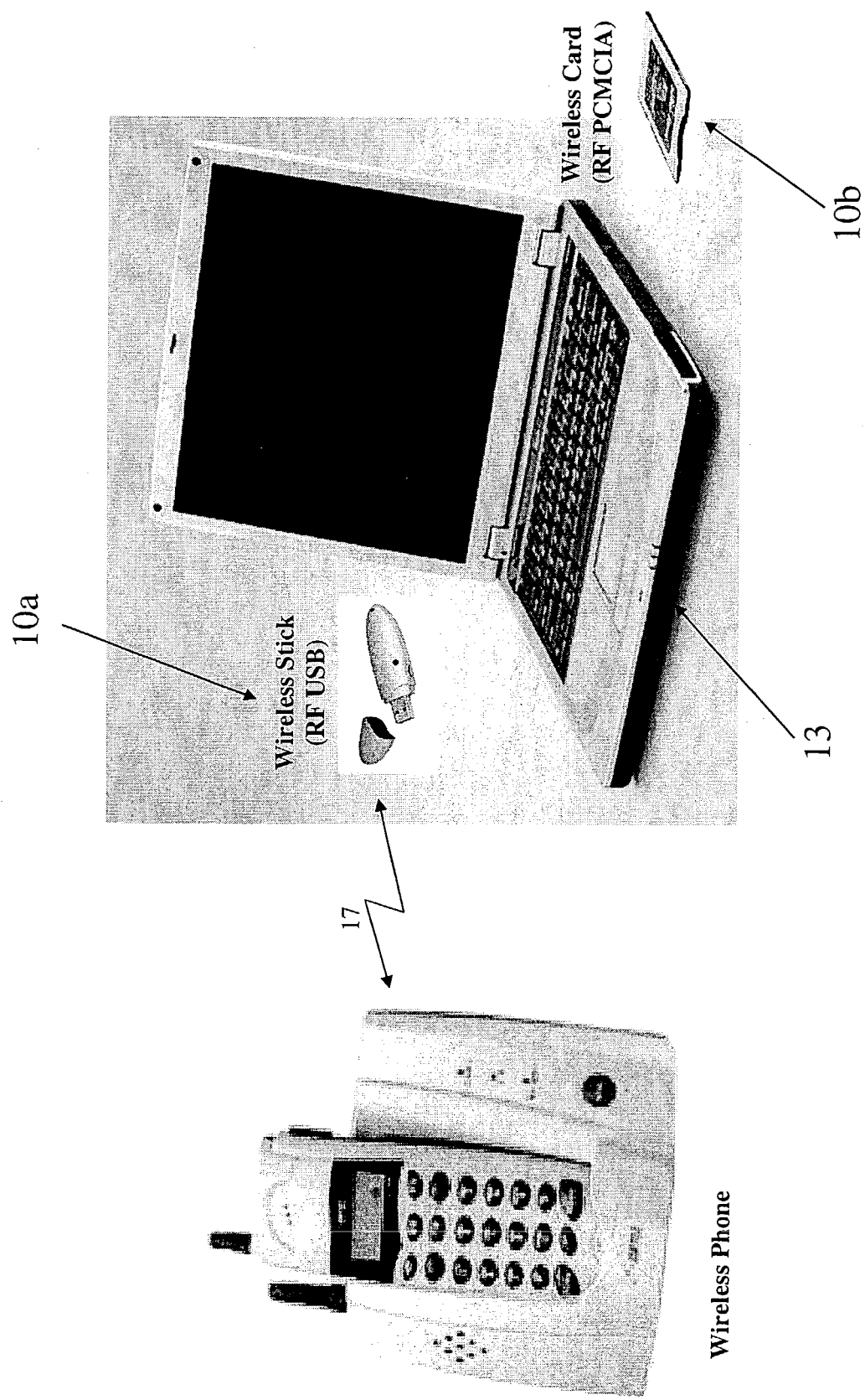
FIG. 7 is a diagram showing a dual function cordless telephone with a base unit and two remote units.

Referring to FIG. 7, the present invention may also be used with Dual Line Cordless telephones. In this case, two independent telephone circuits of such telephones can be equipped to serve only voice signals (cordless telephones), only data signals (wireless links), or voice or data signals (dual function cordless telephones). In FIG. 7, circuitry to establish and support the wireless link is shown as either a PCMCIA card 10*b* or as a USB stick 10*a*.

Yet another embodiment uses a single telephone line in the wireless link. This embodiment may include two remote units as shown in the FIG. 7—one telephone handset and one remote wireless link unit. The telephone line may be used to transmit voice in telephone application or to transmit data via a wireless link.

It is noted that a standard digital cordless telephone may be adapted to provide the dual functionality of a cordless telephone and a wireless link by using the circuitry and methods described herein.

The invention is not limited to the hardware and software configurations shown in FIGS. 1 to 7.

The invention is also not limited to transmitting data over the RF frequency bands described above, or to the specific modulation techniques described herein.

Other embodiments not described herein are also within the scope of the following claims.

What is claimed is:

1. Circuitry to transmit a data signal over a wireless communication link, comprising:
   a receiver that receives the data signal from a telephone line;
   an automatic gain control circuit that keeps a peak amplitude of the data signal substantially constant and within a predetermined linear amplification range prior to a start-up procedure for establishing the wireless communication link; and
   a transmitter that receives the data signal from the automatic gain control circuit and that outputs the data signal, the transmitter having the predetermined linear amplification range, wherein the data signal is not subjected to echo cancellation by an echo canceller prior to output by the transmitter.

2. The circuitry of claim 1, further comprising:
   a hybrid circuit that isolates an incoming data signal from an outgoing data signal, the hybrid circuit obtaining the data signal from the incoming data signal and outputting the data signal to the automatic gain control circuit.

3. The circuitry of claim 1, wherein the automatic gain control circuit uses a dial tone of a telephone connection to set a gain level for the data signal prior to a beginning of communication, the gain level remaining substantially constant during communication.

4. The circuitry of claim 2, wherein the data signal output by the hybrid circuit exceeds the predetermined linear amplification range, and the automatic gain control circuit limits a voltage of the data signal output by the hybrid circuit to reduce nonlinear distortion in the transmitter.

5. The circuitry of claim 1, further comprising:
   a duplexer that maintains separation between transmitted and received data signals.

6. The circuitry of claim 1, wherein the transmitter comprises a radio frequency transmitter.

7. The circuitry of claim 6, wherein the radio frequency transmitter includes a frequency modulation deviator which performs 128-level frequency shift keying (128FSK) modulation of a carrier of the data signal.

8. The circuitry of claim 7, further comprising:
   circuitry to reduce a signal voltage of the data signal prior to input to the frequency modulation deviator.

9. The circuitry of claim 1, further comprising:
   a microprocessor which sends and receives control signals to a remote unit that communicates with the circuitry over the wireless communication link.

10. An apparatus for transmitting a data signal over a wireless communication link, comprising:
    a base unit having a wired connection to a telephone line, the base unit transmitting data to and from the telephone line via the wired connection; and
    a remote unit having a wired connection to a modem, the remote unit transmitting data to and from the modem via the wired connection, the remote unit and the base unit communicating with each other over the wireless communication link;
    wherein the base unit comprises:
       a radio frequency transmitter to transmit an analog data signal to the remote unit;
       an automatic gain control circuit that keeps a peak amplitude of the analog data signal substantially constant and within a predetermined linear amplification range of the radio frequency transmitter prior to a start-up procedure for establishing the wireless communication link wherein the analog data signal is not subjected to echo cancellation by an echo canceller prior to output by the radio frequency transmitter.

11. The apparatus of claim 10, wherein the remote unit comprises a handset of a cordless telephone.

12. The apparatus of claim 10, wherein the remote unit comprises a Peripheral Component Microchannel Interconnect Architecture card.

13. The apparatus of claim 10, wherein the remote unit comprises a Universal Serial Bus connector.

14. The apparatus of claim 10, wherein the modem resides in at least one of a laptop computer, a desktop computer, and a personal digital assistant.

15. The apparatus of claim 10, wherein the base unit further comprises:
    a radio frequency receiver to receive data from the remote unit.

16. The apparatus of claim 10, wherein the base unit, further comprises:
    a hybrid circuit that isolates an incoming data signal from an outgoing data signal, the hybrid circuit obtaining the analog data signal from the incoming data signal and outputting the analog data signal to the automatic gain control circuit.

17. The apparatus of claim 16, wherein the analog data signal output by the hybrid circuit exceeds the predetermined linear amplification range of the transmitter, and the automatic gain control circuit limits a voltage level of the analog data signal to reduce nonlinear distortion in the transmitter.

18. The apparatus of claim 10, wherein the base unit further comprises:
a duplexer that maintains separation between transmitted and received data signals.

19. The apparatus of claim 10, wherein the radio frequency transmitter includes a frequency modulation deviator which performs 128-level frequency shift keying modulation on the analog data signal.

20. The apparatus of claim 19, wherein the base unit further comprises:
circuitry to reduce a signal voltage of the analog data signal prior to input to the frequency modulation deviator.

21. The apparatus of claim 10, wherein the base unit further comprises:
a microprocessor which sends and receives control signals to the remote unit over the wireless communication link.

22. The apparatus of claim 10, wherein the remote unit further comprises:
a hybrid circuit that isolates an incoming data signal from an outgoing data signal, the hybrid circuit producing an output data signal based on the incoming data signal.

23. A system for transmitting analog data or voice over a wireless communication link, the system comprising:
a handset comprising a switch that switches between analog data transmission and voice transmission over the wireless communication link, the switch operating in response to a voltage that is based on connection of a telephone cord; and
a base station that receives an analog data signal from a telephone line, the base station comprising:
a radio frequency transmitter to transmit the analog data signal to the handset; and
an automatic gain control circuit that keeps a peak amplitude of the analog data signal substantially constant and within a predetermined linear amplification range of the radio frequency transmitter prior to a start-up procedure for establishing the wireless communication link wherein the analog data signal is not subjected to echo cancellation by an echo canceller prior to output by the radio frequency transmitter.

24. The system of claim 23, wherein the voice transmission comprises transmitting an analog signal.

25. The system of claim 23, wherein the voice transmission comprises transmitting a digital signal.

26. The system of claim 23, wherein the switch operates in response to detecting, or not detecting, a telephone line connected to the handset.

27. Circuitry to transmit an analog data signal over a wireless communication link, comprising:
a receiver that receives a data signal;
an automatic gain control circuit that keeps a peak amplitude of the data signal substantially constant and within a predetermined linear amplification range prior to a start-up procedure for establishing the wireless communication link; and
a transmitter that receives the data signal from the automatic gain control circuit and that outputs the data signal, the transmitter having the predetermined linear amplification range;
wherein the automatic gain control circuit uses a dial tone of a telephone connection to set a gain level for the data signal, the gain level remaining substantially constant during communication, and wherein the circuitry does not include an echo canceller.

28. The circuitry of claim 27, further comprising:
a hybrid circuit that isolates an incoming data signal from an outgoing data signal, the hybrid circuit obtaining the data signal from the incoming data signal and outputting the data signal to the automatic gain control circuit.

29. The circuitry of claim 27, wherein the data signal output by the hybrid circuit exceeds the predetermined linear amplification range, and the automatic gain control circuit limits a voltage of the data signal output by the hybrid circuit to reduce nonlinear distortion in the transmitter.

30. The circuitry of claim 27, further comprising:
a duplexer that maintains separation between transmitted and received data signals.

31. The circuitry of claim 27, wherein the transmitter comprises a radio frequency transmitter.

32. The circuitry of claim 31, wherein the radio frequency transmitter includes a frequency modulation deviator which performs 128-level frequency shift keying modulation of a carrier of the data signal.

33. The circuitry of claim 32, further comprising:
circuitry to reduce a signal voltage of the data signal prior to input to the frequency modulation deviator.

34. The circuitry of claim 27, further comprising:
a microprocessor which sends and receives control signals to a remote unit that communicates with the circuitry over the wireless communication link.

* * * * *